US012613469B2

(12) United States Patent　　　　　(10) Patent No.:　US 12,613,469 B2

Godet et al.　　　　　　　　　　　　　(45) Date of Patent:　Apr. 28, 2026

(54) METHOD AND APPARATUS FOR GREYSCALE LITHOGRAPHY

(71) Applicant: Applied Materials, Inc., Santa Clara, CA (US)

(72) Inventors: Ludovic Godet, Sunnyvale, CA (US); Hao Tang, San Jose, CA (US); Nai-Wen Pi, San Jose, CA (US); Yongan Xu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 38 days.

(21) Appl. No.: 17/661,927

(22) Filed: May 4, 2022

(65) Prior Publication Data

US 2022/0357668 A1　　Nov. 10, 2022

Related U.S. Application Data

(60) Provisional application No. 63/186,316, filed on May 10, 2021.

(51) Int. Cl.
　G03F 7/00　　　　(2006.01)
(52) U.S. Cl.
　CPC ...... G03F 7/70275 (2013.01); G03F 7/70016 (2013.01); G03F 7/7005 (2013.01); G03F 7/70558 (2013.01)
(58) Field of Classification Search
　CPC ........ G03F 7/20; G03F 7/2002; G03F 7/2004; G03F 7/70; G03F 7/70008;

(Continued)

(56) References Cited

U.S. PATENT DOCUMENTS 4,211,834 A * 7/1980 Lapadula ................ G03F 7/095
　　　　　　　　　　　　　　　　　　　430/326
4,241,389 A * 12/1980 Heimer ............... G03F 7/70058
　　　　　　　　　　　　　　　　　　　362/346

(Continued)

FOREIGN PATENT DOCUMENTS

JP　　　H10116774 A　*　5/1998　......... G03F 7/70358
JP　　　3629801 B2　*　3/2005　......... G03F 7/70575
JP　　　2006-253487 A　　9/2006

OTHER PUBLICATIONS

English translation of JP3629801, published Mar. 16, 2005. (Year: 2005).*

(Continued)

*Primary Examiner* — Christina A Riddle
(74) *Attorney, Agent, or Firm* — Patterson + Sheridan, LLP

(57) ABSTRACT

An image projection system is provided. The system can be used for performing lithography. The system includes a deuterium light source, a converging lens coupled to the deuterium light source. The system includes an aperture configured to provide image tiling disposed adjacent to the converging lens. The system includes a movable stage disposed adjacent to the aperture. A method of fabricating an optical device is provided. The method includes depositing a resist over a substrate and determining an exposure pattern for the optical device. The method includes exposing a portion of the resist with a light beam based on the determined exposure pattern. Exposing the portion of the resist includes directing the light beam from a deuterium light source to the substrate and developing the resist.

17 Claims, 3 Drawing Sheets

(58) Field of Classification Search
CPC ............. G03F 7/70016; G03F 7/70275; G03F
7/70283; G03F 7/70558; G03F 7/7005;
G03F 7/70391; G03F 7/70475; G03F
7/70425; G03F 7/704; G03F 7/70383;
G03F 7/70375; G03F 7/70316; G03F
7/70291; G03F 7/70225; G03F 7/702;
G03F 7/70208; G03F 7/70191; G03F
7/7015; G03F 7/70175; G03F 7/70058;
G03F 7/70066; G03F 7/70083; G03F
7/70091
USPC ........ 355/18, 30, 52–55, 67–77, 133; 430/5,
430/22, 30; 362/230–231, 234, 235, 236,
362/241, 247, 257, 263, 268, 296.01, 297,
362/299, 311.06, 311.08, 311.11, 311.12;
250/492.1, 492.2, 492.22, 492.23, 493.1,
250/494.1, 503.1, 504 R, 505.1, 515.1
See application file for complete search history.

(56) References Cited

U.S. PATENT DOCUMENTS

| | | | | | |
|---|---|---|---|---|---|
| 4,267,258 | A | * | 5/1981 | Yoneda | G03F 7/038 |
| | | | | | 430/286.1 |
| 5,168,021 | A | * | 12/1992 | Arai | G03F 7/168 |
| | | | | | 430/30 |
| 5,627,626 | A | * | 5/1997 | Inoue | G03F 7/70333 |
| | | | | | 355/71 |
| 8,216,773 | B1 | * | 7/2012 | Delgado | H01J 61/0737 |
| | | | | | 430/311 |
| 2003/0137644 | A1 | * | 7/2003 | Tanaka | G03F 7/70216 |
| | | | | | 355/71 |
| 2003/0227607 | A1 | * | 12/2003 | Kato | G03F 7/70275 |
| | | | | | 355/53 |
| 2004/0075882 | A1 | * | 4/2004 | Meisburger | G03F 7/70558 |
| | | | | | 359/290 |
| 2004/0218262 | A1 | * | 11/2004 | Chuang | G02B 21/02 |
| | | | | | 359/366 |
| 2005/0213068 | A1 | * | 9/2005 | Ishii | G03F 7/70358 |
| | | | | | 355/53 |
| 2007/0013921 | A1 | | 1/2007 | Pellemans et al. | |
| 2007/0146677 | A1 | | 6/2007 | Suzuki | |
| 2008/0094721 | A1 | * | 4/2008 | Moss | H04N 9/315 |
| | | | | | 359/638 |
| 2010/0046092 | A1 | | 2/2010 | Shmarev et al. | |
| 2010/0097594 | A1 | * | 4/2010 | Cho | G01N 21/253 |
| | | | | | 355/71 |
| 2013/0003166 | A1 | | 1/2013 | Williamson | |
| 2013/0027681 | A1 | * | 1/2013 | Mann | G03F 7/70166 |
| | | | | | 359/350 |
| 2016/0305822 | A1 | * | 10/2016 | Mizuguchi | G01J 5/0003 |
| 2021/0063883 | A1 | * | 3/2021 | Tanaka | G03F 7/40 |

OTHER PUBLICATIONS

English translation of JPH10-116774, published May 6, 1998. (Year: 1998).*
International Search Report and Written Opinion dated Aug. 17, 2022 for Application No. PCT/US2022/027614.
Taiwan Office Action for Application No. 111116188 dated Nov. 20, 2025.

* cited by examiner

400

DEPOSIT A RESIST OVER A SUBSTRATE    402

DETERMINE AN EXPOSURE PATTERN FOR THE OPTICAL DEVICE    404

EXPOSE A PORTION OF THE RESIST WITH A LIGHT BEAM BASED ON THE DETERMINED EXPOSURE PATTERN, WHEREIN EXPOSING THE PORTION OF THE RESIST COMPRISES DIRECTING THE LIGHT BEAM FROM A DEUTERIUM LIGHT SOURCE    406

DEVELOP THE PATTERNED RESIST    408

METHOD AND APPARATUS FOR GREYSCALE LITHOGRAPHY

CROSS-REFERENCE TO RELATED APPLICATIONS

This Application claims the benefit of U.S. Provisional Application 63/186,316 filed on May 10, 2021, which is incorporate herein by reference in its entirety.

BACKGROUND

Field

Embodiments of the present disclosure generally relate to optical devices for augmented, virtual, and mixed reality. More specifically, embodiments described herein provide systems and methods for greyscale lithography to fabricate optical devices.

Description of the Related Art

Virtual reality is generally considered to be a computer-generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device, or handheld device, to view the surrounding environment, yet also see images of virtual objects that are generated in the display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is displaying a virtual image overlayed on an ambient environment. Optical devices are used to assist in overlaying images. Generated light is propagated through a waveguide until the light exits the waveguide and is overlayed on the ambient environment. Fabricating optical devices can be challenging as optical devices tend to have non-uniform properties. Accordingly, improved systems and method of fabricating optical devices are needed in the art.

SUMMARY

In some embodiments, an image projection system is provided. The system can be used for performing lithography. The system includes a deuterium light source, a converging lens coupled to the deuterium light source. The system includes an aperture disposed adjacent to the converging lens. The system includes a movable stage disposed adjacent to the aperture.

In some embodiments, an image projection system for performing lithography is provided. The system includes a deuterium light source including an array of deuterium light sources. The system includes an elliptical reflector downstream of the deuterium light source along a beam path from the deuterium light source. The system includes an optical integrator disposed downstream of the elliptical reflector, a mirror disposed downstream of the optical integrator, and a collimating lens disposed downstream of the mirror. The system includes a stage disposed downstream of the collimating lens.

In some embodiments, a method of fabricating an optical device is provided. The method includes depositing a resist over a substrate and determining an exposure pattern for the optical device. The method includes exposing a portion of the resist with a light beam based on the determined exposure pattern. Exposing the portion of the resist includes directing the light beam from a deuterium light source to the substrate and developing the resist.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a system, a software application, and a method of a lithography process, such as a digital lithography process, to write grey tone portions. One embodiment of the system includes a controller configured to provide mask pattern data to a lithography system. The mask pattern data has a plurality of grey tone exposure polygons. The lithography system has a processing unit with a plurality of image projection systems that receive the mask pattern data. Each image projection system includes a spatial light modulator with a plurality of spatial light modulator pixels to project a multiplicity of shots. The controller is configured to divide the plurality of spatial light modulator pixels temporally by grey tone shots of the multiplicity of shots, and the controller is configured to vary an intensity of a light beam generated by a deuterium light source of each image projection system at the grey tone shots.

Figure 1:
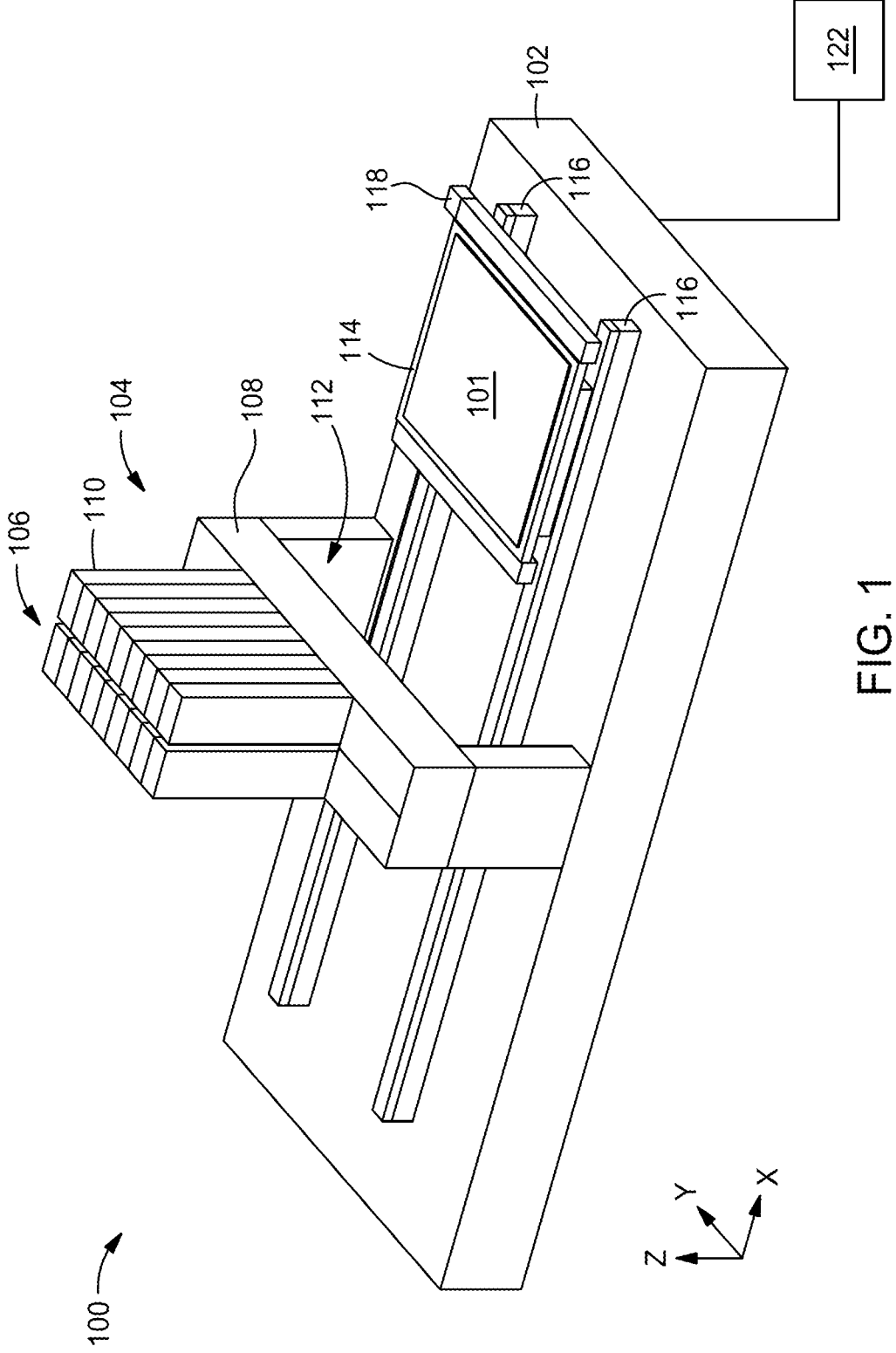
FIG. 1 is a schematic view of a lithography system, according to some embodiments.

FIG. 1 is a perspective view of a system 100, such as a digital lithography system, that may benefit from embodiments described herein. The system 100 includes a stage 114 and a processing apparatus 104. In some embodiments, the stage 114 is supported by a pair of tracks 116 disposed on a slab 102. A substrate 101 is supported by the stage 114. The stage 114 is supported by a pair of tracks 116 disposed on the slab 102. The stage 114 moves along the pair of tracks 116 in the X direction as indicated by the coordinate system shown in FIG. 1. In one embodiment, which can be combined with other embodiments described herein, the pair of tracks 116 is a pair of parallel magnetic channels. As shown, each track of the pair of tracks 116 extends in a straight line path. An encoder 118 is coupled to the stage 114 in order to provide information of the location of the stage 114 to a controller 122. In some embodiments, the stage 114 is coupled to an actuator and is movable in an x, y, and z direction. In some embodiments, the stage 114 is movable using magnetic levitation without the use of tracks (not shown).

The controller 122 is generally designed to facilitate the control and automation of the processing techniques described herein. The controller 122 may be coupled to or in communication with the processing apparatus 104, the stage 114, and the encoder 118. The processing apparatus 104 and the encoder 118 may provide information to the controller 122 regarding the substrate processing and the substrate aligning. For example, the processing apparatus 104 may provide information to the controller 122 to alert the controller 122 that substrate processing has been completed. The controller 122 facilitates the control and automation of methods of performing a grayscale lithography. A program (or computer instructions), which may be referred to as an imaging program, readable by the controller 122, determines which tasks are performable on a substrate 101. The program includes a mask pattern data and code to monitor and control the processing time and substrate position. The mask pattern data corresponding to a pattern to be written into the photoresist using the electromagnetic radiation.

The substrate 101 comprises any suitable material, for example, glass, which is used as part of a wearable display device. In other embodiments, which can be combined with other embodiments described herein, the substrate 101 is made of other materials capable of being used as a part of the wearable display device. The substrate 101 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate) (PMMA), poly(methyl glutarimide), and SU-8. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel.

Figure 2:
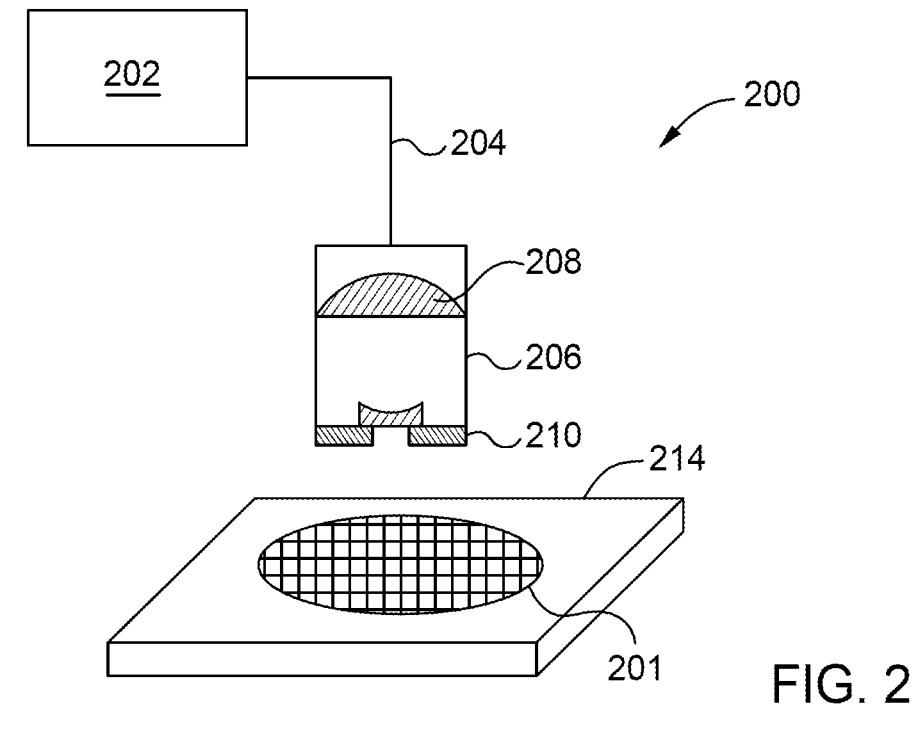
FIG. 2 is a schematic view of an image projection system, according to some embodiments.
Figure 3:
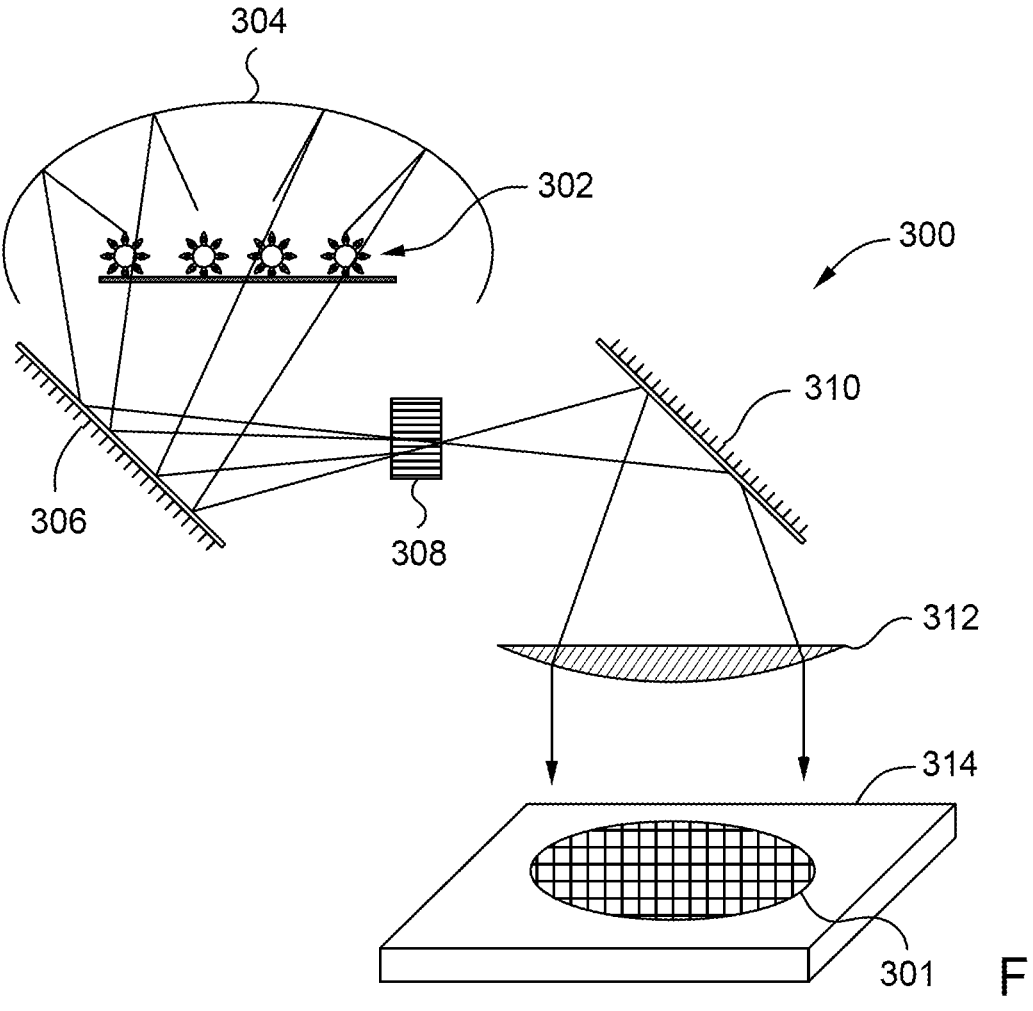
FIG. 3 is a schematic view of an image projection system, according to some embodiments.

The processing apparatus 104 includes a support 108 and a processing unit 106. The processing apparatus 104 straddles the pair of tracks 116 and is disposed on the slab 102, and thereby includes an opening 112 for the pair of tracks 116 and the stage 114 to pass under the processing unit 106. The processing unit 106 is supported over the slab 102 by a support 108. In one embodiment, which can be combined with other embodiments described herein, the processing unit 106 is a pattern generator configured to expose photoresist in a photolithography process. In some embodiments, which can be combined with other embodiments described herein, the pattern generator is configured to perform a maskless lithography process. The processing unit 106 includes a plurality of image projection systems. Examples of image projection systems are shown in FIG. 2 and FIG. 3. In some embodiments, each image projection system is disposed in a case 110. Alternatively, the processing apparatus 104 includes a single image projection system. The processing unit 106 is useful to perform maskless direct pattern writing to photoresist or other electromagnetic radiation sensitive material.

FIG. 2 is a schematic view of an image projection system 200. The system 200 is operable to perform grayscale lithography on a resist to fabricate optical devices. The system 200 includes a deuterium light source 202, a housing 206, and a stage 214, such as the stage 114 depicted in FIG. 1. The deuterium light source 202 is operable to produce light having a wavelength of about 120 nm to about 900 nm, such as about 180 nm to about 370 nm, such as about 200 nm to about 315nm. Without being bound by theory, it is believed that light of a wavelength of about 200 nm to about 240 nm produced by the deuterium light source 202 has a greater spatial irradiance than light of substantially the same wavelength produced by a mercury-vapor light source.

It has been discovered that the deuterium light source 202 efficiently develops deep-uv photoresists, such as PMMA photoresists. Increased efficiency leads to reduced exposure time and increased throughput of devices. In some embodiments, exposure time of a photoresist is about 10 minutes or less, such as about 8 minutes or less, such as about 6 minutes or less. In some embodiments, the deuterium light source 202 reduces an exposure time of processing a photoresist by about 50% or less, such as about 5% to about 40%, such as about 10% to about 30%, such as about 15% to about 25%, relative to other light sources, such as mercury-vapor light sources at the same power.

The deuterium light source 202 is capable of directing light to the housing 206 via an optical fiber 204. The housing 206 includes a converging lens 208 and an aperture 210 through which the light from the deuterium light source 202 is directed. In some embodiments, the converging lens 208 increases the intensity of the light produced by the deuterium light source 202. In some embodiments, the converging lens 208 is a double convex lens. In some embodiments, the aperture 210 is shaped to enable image tiling and exposes a photoresist disposed over a substrate 201 that is disposed on the stage 214. In some embodiments, the aperture is shaped like a polygon, such as a square, or a rectangular (e.g., slits). In some embodiments, the aperture is sized to enable exposure of an entire surface area of a substrate. Alternatively, the aperture is sized to scan a portion of the surface area of a substrate, such as a "tile." As used herein, the term "image tiling" refers to scanning a plurality of portions of the surface of the substrate, e.g., tiles, and stitching the tiles together to form a large image.

The exposures, or write beams together form a plurality of pixels of the mask pattern. In some embodiments, each deuterium light source 202 has a power of about 50 W or greater, such as 100 W to about 5,000 W to increase light intensity. The image projection system 200 enables easy access and replacement of the deuterium light sources for maintenance purposes. Use of deuterium light sources instead of mercury based light sources provide environmental benefits. It has been discovered that using deuterium light sources provide a cost benefit, a longer life, an increased intensity relative to other light sources operating at the same power, and a lower temperature at the same power relative to other light sources, such as mercury-vapor light sources. In some embodiments, the deuterium light source operates at a temperature of about 23° C. to 100° C., such as about 50° C. to about 80° C.

FIG. 3 is a schematic view of an image projection system 300. The system 300 is operable to perform grayscale lithography on a resist to fabricate optical devices. The system 300 includes a deuterium light source array 302 that projects beams of light to an elliptical reflector 304. The elliptical reflector 304 includes a convex side and a concave side. In some embodiments, the concave side of the elliptical reflector 304 is oriented downward toward a horizontally positioned deuterium light source array 302. In some embodiments, the concave side of the elliptical reflector 304 is oriented at an angle relative to the horizontal axis, such as about 5° to about 180°, such as at 90° in which the elliptical reflector 304 is positioned vertically. The deuterium light source array 302 is similarly oriented in any of the angles described relative to the elliptical reflector 304 and substantially parallel to the elliptical reflector 304. Each light source of the deuterium light source array 302 increases the intensity of light projected to the substrate 301 disposed on the stage 314. In some embodiments, such as when the elliptical reflector 304 is positioned horizontally, the elliptical reflector 304 directs the beams to a dielectric mirror 306 that focuses the beams to an optical integrator 308. In some embodiments, the dielectric mirror 306 includes a metal material. In some embodiments, the dielectric mirror 306 is composed of an oxide-containing material, a silicon-containing material, or combinations thereof. In some embodiments, the dielectric mirror 306 is a Fresnel dielectric mirror. Without being bound by theory, it is believed that the dielectric mirror 306 provides light uniformity to be directed to the substrate 101. The elliptical reflector 304 includes a convex shape or other shapes. In some embodiments, such as when the elliptical reflector 304 and the deuterium light source array 302 are positioned vertically, the elliptical reflector 304 directs the beams directly to the optical integrator 308. In some embodiments, the beam contacts a mirror 310 and is directed to a collimating lens 312. The optical integrator 308 is operable to receive scattered light from the elliptical reflector 304 and consolidate the light into a single focused light. In some embodiments, the optical integrator 308 includes a plurality of lenses operable to focus light. In some embodiments, a mask may be disposed between the collimating lens 312 and the stage 314. Alternatively, the system described herein is maskless. In some embodiments, the mirror 310 is an aluminum mirror. The image projection system 300 enables easy access and replacement of the deuterium light sources for maintenance purposes.

Figure 4:
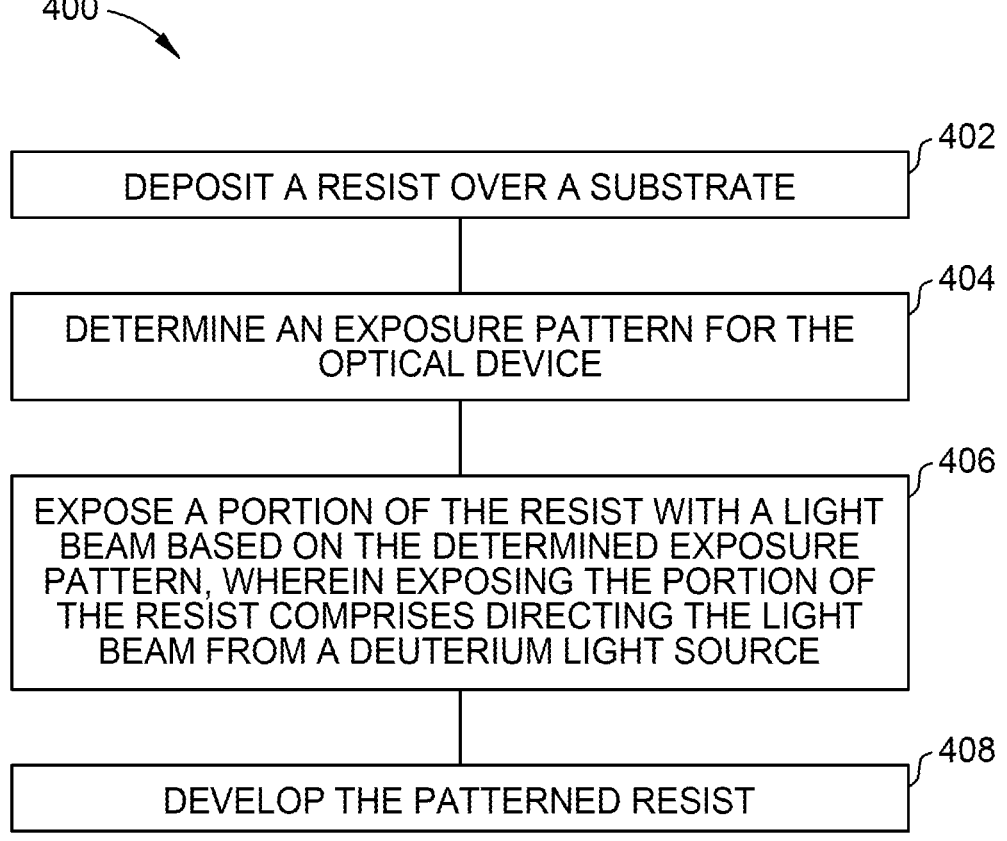
FIG. 4 is a flow diagram depicting a method of forming a device, according to some embodiments.

FIG. 4 is a flow diagram depicting a method 400 of forming a device, according to some embodiments. The method includes, at activity 402, depositing a resist over a substrate, such as substrate 101 depicted in FIGS. 1, 2, and 3. In some embodiments, the resist is deposited over an underlying film disposed below the resist and over the substrate. The underlying film can be the uppermost surface in a film stack disposed over the substrate.

In activity 404, an exposure pattern is determined for forming the device. In activity 406, a portion of the resist is exposed with a light beam based on the determined exposure pattern. The portion of the resist includes directing the light beam from a deuterium light source, such as the deuterium light source 202 depicted in FIG. 2 or the deuterium light source 302 depicted in FIG. 3. The light beam can have a beam path from the deuterium light source 202, as shown in FIG. 2 through an optical fiber 204, to a converging lens 208 in a housing 206. The light beam can be directed along the beam path from the converging lens 208 to an aperture 210 of the housing 206. The light beam can be directed along the beam path from the aperture 210 to a portion of the substrate 101.

Alternatively, the light beam can have a beam path from the deuterium light source 302 to a concave surface of an elliptical reflector 304. In some embodiments, the elliptical reflector 304 can direct the light beam along the beam path directly to an optical integrator 308. In some embodiments, the elliptical reflector 304 can direct the light beam along the beam path to one or more mirrors, such as dielectric mirror 306 prior to the optical integrator 308. In some embodiments, the light beam can be directed along the beam path from the optical integrator 308 to one or mirrors, such as mirror 310, such as an aluminum mirror. The light beam can be directed from the mirror 310 to a collimating lens 312. The light beam can be directed from the collimating lens to the substrate 101.

In activity 408, the resist having portions that were exposed to light beams from the deuterium light source, is developed using a photoresist developer. The portions that are exposed are soluble to the photoresist developer such that developing the resist provides a patterned resist on an underlying film layer. The method can further include etching portions of the underlying film layer through openings in the developed resist.

The method and systems provided herein enable a lithography process that uses a deuterium light source. Using the deuterium light source in place of other light sources such as mercury-vapor light sources, provides a more efficient process with longer use life and increased device throughput.

While the foregoing is directed to embodiments of the present disclosure, other and further embodiments of the disclosure may be devised without departing from the basic scope thereof, and the scope thereof is determined by the claims that follow.

What is claimed is:

1. A lithography system for performing lithography, comprising:
   a plurality of image projection systems, each image projection system comprising:
     a deuterium light source;
     a housing, wherein the housing is directly coupled to the deuterium light source at a first end of the housing, the housing having a second end with an opening therein;
     a converging lens disposed inside the housing in a path of an optical fiber; and
     an aperture coupled to the second end of the housing with the opening of the housing in a path of the converging lens; and
   a movable stage disposed immediately adjacent to the aperture, wherein the movable stage is configured to move along at least three axes and relative to at least one of the deuterium light source, the converging lens, and the aperture.

2. The lithography system of claim 1, wherein the converging lens and the aperture are disposed in the housing.

3. An image projection system for performing lithography, comprising:
   a deuterium light source comprising an array of deuterium light sources;

an elliptical reflector downstream of the deuterium light source along a beam path from the deuterium light source, wherein the array of deuterium light sources are substantially parallel to a major axis of the elliptical reflector;

an optical integrator disposed downstream of the elliptical reflector;

a mirror disposed immediately downstream of the optical integrator;

a collimating lens disposed downstream of the mirror; and a stage disposed downstream of the collimating lens.

4. The image projection system of claim 3, wherein the mirror is an aluminum mirror.

5. The image projection system of claim 3, wherein the elliptical reflector is positioned with a concave side directed in a direction of a surface of the stage.

6. The image projection system of claim 3, further comprising a dielectric mirror disposed between the elliptical reflector and the mirror along the beam path.

7. The image projection system of claim 3, wherein the elliptical reflector is positioned with a concave side directed in a direction perpendicular to a surface of the stage.

8. A method of fabricating an optical device, the method comprising:

exposing a portion of a resist disposed over a substrate with light beams based on a determined exposure pattern using an image projection system comprising:

a deuterium light source comprising an array of deuterium light sources;

an elliptical reflector downstream of the deuterium light source along a beam path from the deuterium light source, wherein the array of deuterium light sources are substantially parallel to a major axis of the elliptical reflector;

an optical integrator disposed downstream of the elliptical reflector:

a mirror disposed immediately downstream of the optical integrator;

a collimating lens disposed downstream of the mirror; and a stage disposed downstream of the collimating lens, wherein exposing the portion of the resist comprises directing the light beams from the array of deuterium light sources to the stage; and developing the resist.

9. The method of claim 8, wherein the resist is composed of poly (methyl methacrylate) (PMMA).

10. The method of claim 8, wherein the developing the resist exposes portions of an underlying film layer.

11. The method of claim 10, further comprising etching the underlying film layer through openings in the developed resist.

12. The method of claim 8, wherein the deuterium light source operates at a temperature of about 23° C. to 100° C.

13. A non-transitory computer-readable medium storing instructions that, when executed by a processor, cause a computer system to perform the method of claim 8.

14. The method of claim 8, wherein the mirror is an aluminum mirror.

15. The method of claim 8, wherein the elliptical reflector is positioned with a concave side directed in a direction of a surface of the stage.

16. The method of claim 8, further comprising a dielectric mirror disposed between the elliptical reflector and the mirror along the beam path.

17. The method of claim 8, wherein the elliptical reflector is positioned with a concave side directed in a direction perpendicular to a surface of the stage.

* * * * *